(12) United States Patent
Parkinson et al.

(10) Patent No.: US 6,768,665 B2
(45) Date of Patent: Jul. 27, 2004

(54) REFRESHING MEMORY CELLS OF A PHASE CHANGE MATERIAL MEMORY DEVICE

(75) Inventors: Ward D. Parkinson, Boise, ID (US); Tyler A. Lowrey, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 25 days.

(21) Appl. No.: 10/212,630

(22) Filed: Aug. 5, 2002

(65) Prior Publication Data

US 2004/0022085 A1 Feb. 5, 2004

(51) Int. Cl.[7] .............................................. G11C 13/00
(52) U.S. Cl. ...................... 365/113; 365/163; 365/148
(58) Field of Search .................................. 365/163, 113, 365/148, 222, 189.01

(56) References Cited

U.S. PATENT DOCUMENTS 4,228,524 A  * 10/1980 Neale et al. ................. 365/163
6,570,784 B2 *  5/2003 Lowrey ....................... 365/163

* cited by examiner

Primary Examiner—David Lam
(74) Attorney, Agent, or Firm—Anthony M. Martinez

(57) ABSTRACT

Briefly, in accordance with an embodiment of the invention, an apparatus and method to provide refreshing of a memory cell of a phase change memory device is provided. The method includes determining whether a storage level of a phase change memory cell is within a predetermined margin from a resistance threshold. In response to the determination, the cell is selectively written. The apparatus includes a circuit to: determine whether a storage level of a phase change memory cell is within a predefined margin from a resistance threshold level; and in response to the determination, selectively write to the cell.

54 Claims, 14 Drawing Sheets

110

| A0 | A1 | WB0 | WB1 | X0 | X1 | X2 | X3 |
|----|----|-----|-----|----|----|----|----|
| L | L | L | L | H | H | H | L |
| L | H | L | L | H | H | L | H |
| H | L | L | L | H | L | H | H |
| H | H | L | L | L | H | H | H |
| X | L | H | L | L | H | L | H |
| X | H | H | L | H | L | H | L |
| X | X | H | H | L | L | L | L |

FIG. 10

REFRESHING MEMORY CELLS OF A PHASE CHANGE MATERIAL MEMORY DEVICE

BACKGROUND

This invention generally relates to electronic memories, and more particularly, the invention relates to refreshing memory cells of a phase change material memory device.

A phase change material may be used to store the memory state of a memory cell of a semiconductor memory device. In this manner, phase change materials that are used in phase change material memory devices may exhibit at least two different states. The states may be called the amorphous and crystalline states. Transitions between these states may be selectively initiated. The states may be distinguished because the amorphous state generally exhibits higher resistivity than the crystalline state. The amorphous state involves a more disordered atomic structure. Generally any phase change material may be utilized to exhibit these two states. However, as an example, thin-film chalcogenide alloy materials may be particularly suitable.

The phase change may be induced reversibly. Therefore, the phase change material may change from the amorphous to the crystalline state and may revert back to the amorphous state thereafter, or vice versa, in response to temperature changes. In effect, when the phase change material is used in a memory cell, the memory cell may be thought of as a programmable resistor, which reversibly changes between higher and lower resistance states. The phase change may be induced by resistive heating that is caused by a current that flows through the material.

BRIEF DESCRIPTION OF THE DRAWING

FIG. 10 is a truth table associated with a row decoder of the phase change material memory device of FIG. 9 according to an embodiment of the invention.

DETAILED DESCRIPTION

Figure 2:
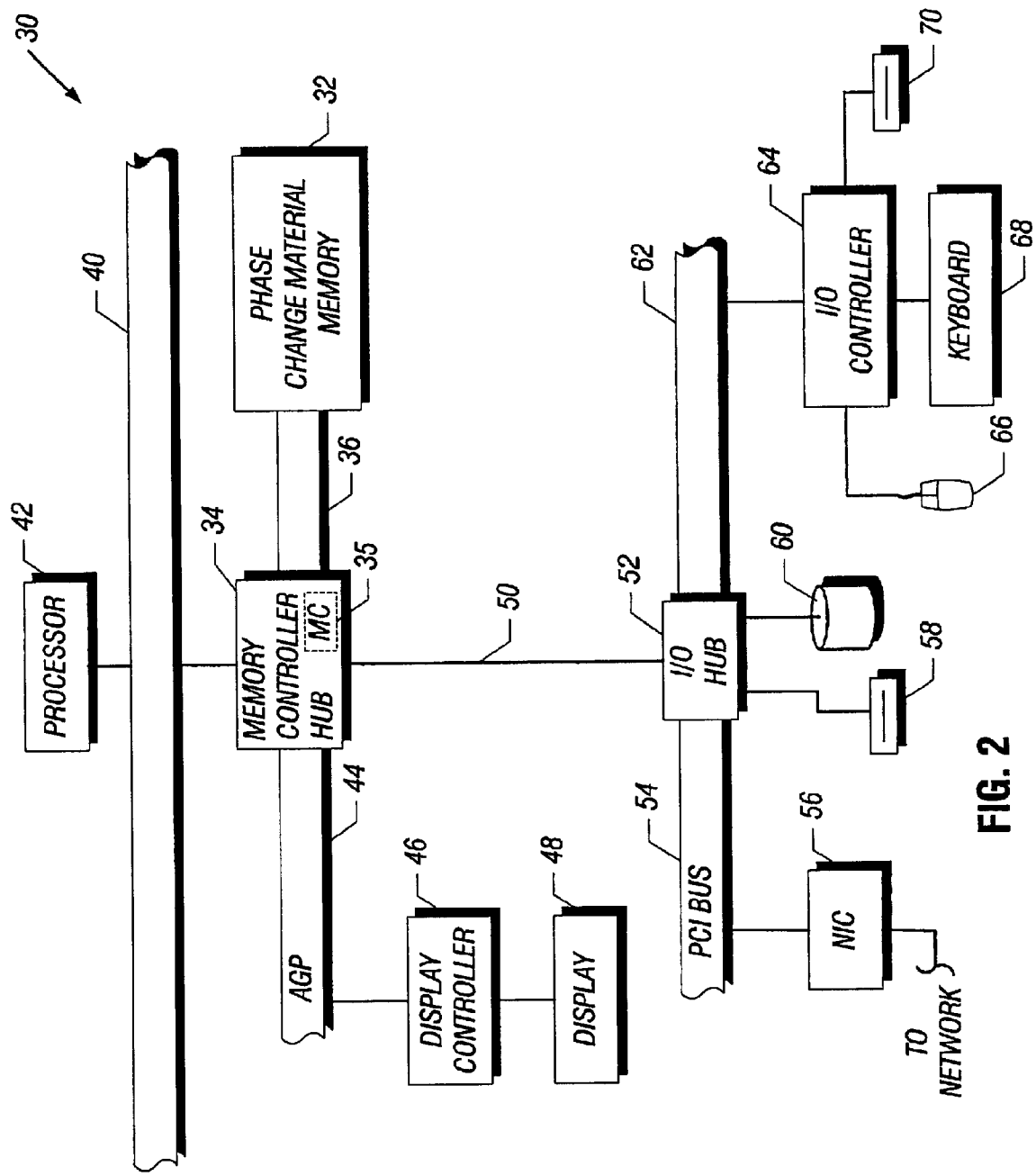
FIG. 2 is a schematic diagram of a computer system according to an embodiment of the invention.

Referring to FIG. 2, an embodiment 30 of a computer system in accordance with the invention includes a phase change material memory 32 that communicates with a memory controller hub 34 via a memory bus 36. The memory bus 36 includes communication lines for communicating data to and from the memory 32 as well as control and address lines for controlling the storage and retrieval of data to and from the memory 32. A particular write or read operation may involve concurrently writing data to or reading data from several devices of memory 32.

As an example, in some embodiments of the invention, the phase change material memory 32 may include various memory devices (semiconductor memory chips, or packages, for example), each of which includes phase change material-based memory cells. As an example, each memory cell of a particular memory device may include a phase change material (a thin-film chalcogenide alloy material, for example) that exhibits crystalline and amorphous phases. These states, in turn, are used to indicate the memory states ("1" and "0" states, for example) of the memory cell.

The memory cell of a phase change memory device is not limited to just two memory states (i.e., a "1" state and a "0" state), but instead the memory cell may have a large number of states. That is, because each state may be distinguished by its resistance, a number of resistance determined states may be possible, allowing the storage of multiple bits of data in a single memory cell.

A variety of phase change alloys are known. Generally, chalcogenide alloys contain one or more elements from Column VI of the periodic table. One particularly suitable group of alloys is the GeSbTe alloys.

Figure 1:
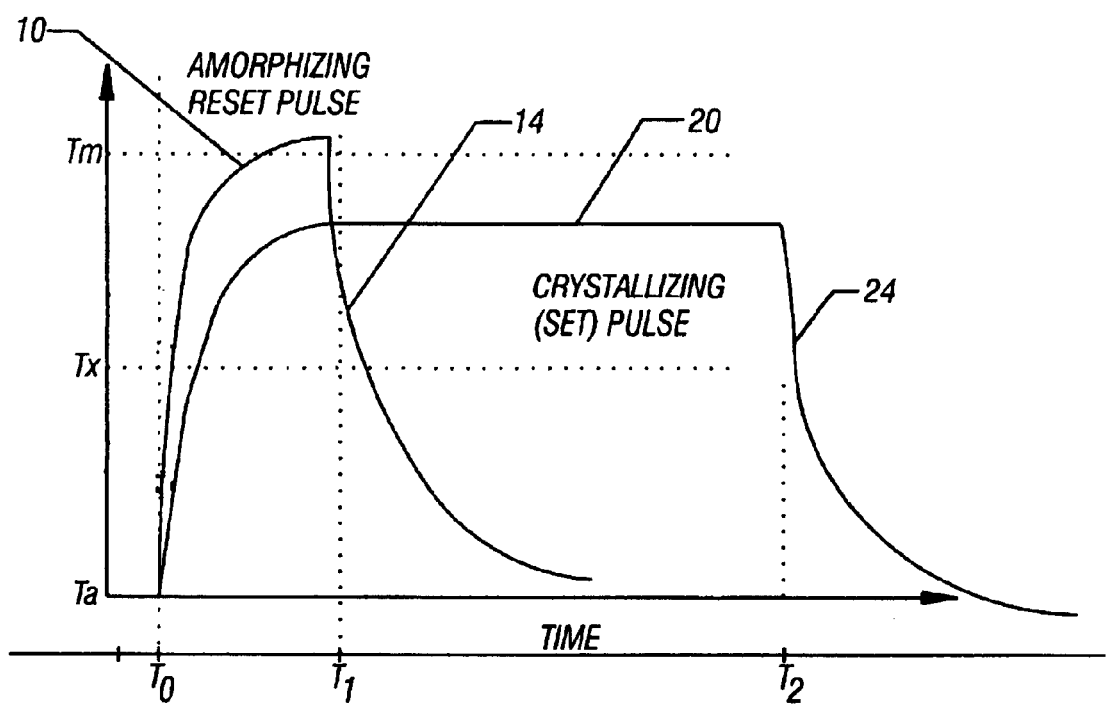
FIG. 1 depicts temperature waveforms for setting and resetting a memory cell of a phase change material memory device.

For purposes of writing a bit of data to a phase change memory cell, the cell may be either set (to store a "1" bit of data, for example) via a current pulse called a set current pulse or reset via a current pulse (to store a "0" bit of data, for example) called a reset pulse. As an example, FIG. 1 depicts a crystallizing set pulse 20 that generally extends from about time $T_0$ to time $T_2$ to place the phase change material of a particular cell in the crystalline state. As shown, the set pulse 20 represents a momentary rise in the temperature of the phase change material.

The set pulse 20 is to be contrasted to the reset pulse 10, a pulse that is also associated with a higher temperature of the phase change material but may have significantly shorter duration, as the reset pulse 10 extends from about time $T_0$ to $T_1$. Thus, the reset pulse 10 may be used to transform a phase change material-based memory cell from the crystalline state to the amorphous state, or "reset" the state of the memory cell to "0." In contrast, the set pulse 20 may be used to set the stale of the memory cell to "1." Preferably, the set heating is slowly removed because this tends to leave the cell in an optimum crystallized set state and allows use of the same peak heating used with reset. For reset the heating must be quenched rapidly to avoid crystallization. Since the heating is done with current, preferably the reset current is 1.5 times the minimum required to reset a bit with a width of about 50 nsec and a trailing edge 14 under 10 nsec. The set current peak and width is about the same as reset, but the trailing edge 24 is preferably much slower and on the order of a microsecond fall time. These timings and the magnitude of the reset current will vary with the phase change material selected and size and type of electrodes on each side of the material. Preferably, with a contact less than 0.05 u, electrodes of TiAlN, and side spacers of nitride, the reset current may be less than 4 ma.

For purposes of reading the bit of data that is stored in the phase change memory cell, a current is routed through the memory cell to cause a voltage to develop across the cell. This voltage, in turn, is proportional to the resistance exhibited by the cell. Thus, a higher voltage indicates that the cell is in the amorphous state, the higher resistance state; and a lower voltage indicates that the cell is in the crystalline state, the lower resistance state.

It is assumed herein that the memory cell is deemed to indicate a "1" bit of data when its phase change material is in the crystalline state and indicate a "0" bit of data when its phase change material is in the amorphous state. However, it is noted, that in other embodiments of the invention, this convention may be reversed, i.e., the memory cell in these embodiments is deemed to indicate a "0" bit of data when its phase change material is in the crystalline phase and indicate a "1" bit of data when its phase change material is in the amorphous phase.

For purposes of detecting the memory state of a particular cell, the non-inverting input terminal of a comparator may be coupled to the cell to receive an indication of the cell voltage produced by forcing a current, such as 10 $\mu$a through the cell. As an example, the inverting input terminal of the comparator may be coupled to a threshold voltage that serves as a reference for purposes of distinguishing a "1" bit from a "0" bit. Thus, the comparator compares the cell voltage to this threshold voltage to generate an indication of whether the memory cell stores a "1" bit of data or stores a "0" bit of data. This comparison produces an output signal (indicative of the read bit) and may be stored in a latch or flip-flop.

The threshold voltage may be formed, for example, by the product of a threshold resistance (of a threshold resistor) and a current. This current, in turn, may have (for example) the same magnitude as the current that flows through the memory cell during the reading of its stored bit. In this manner, the threshold resistor may have a resistance somewhere between the resistance of the memory cell for a "1" bit of data and the resistance of the memory cell for a "0" bit of data. Thus, the product of the resistance of the threshold resistor and the current that flows through the threshold resistor produces the threshold voltage, a voltage that is located somewhere between the read voltage of the memory cell when in the amorphous state and the read voltage of the memory cell when in the crystalline state.

A potential difficulty with the use of the phase change memory cell is that for a number of different possible reasons, the resistance that is exhibited by the cell to indicate a particular memory state may be unacceptably close to a threshold that distinguishes that particular memory state from another memory state. For example, for a two memory state cell, the cell may have a resistance that indicates the amorphous state, a memory state that may be associated with the bit "0," for example. However, the resistance of the cell may be close to a threshold resistance that defines the transition between the amorphous and crystalline states. Thus, if an inadvertent slight change occurs in the cell's resistance, the cell's resistance may indicate the crystalline state, a state that may be associated with the bit "1," for example. Therefore, it is generally desirable to have a sufficient margin between the resistance of the cell and the threshold resistance that defines the transition between memory states of the cell.

An insufficient margin may be caused by the use of incorrect slopes and/or magnitudes by the set pulse and/or the reset pulse; and the insufficient margin may be the result of one or more reads from the memory cell. For example, flowing current through a particular phase change memory cell to read a bit of data from the cell may partially change the resistance exhibited by the cell. As a more specific example, if the memory cell is in the amorphous state (for example), reading data from the cell may partially crystallize the phase change material of the cell, thereby undesirably lowering the resistance that is exhibited by the cell. As a result, the integrity of the memory state that is exhibited by the cell may be compromised, especially if subsequent reads from the cell further change the cell's resistance.

Figure 3:
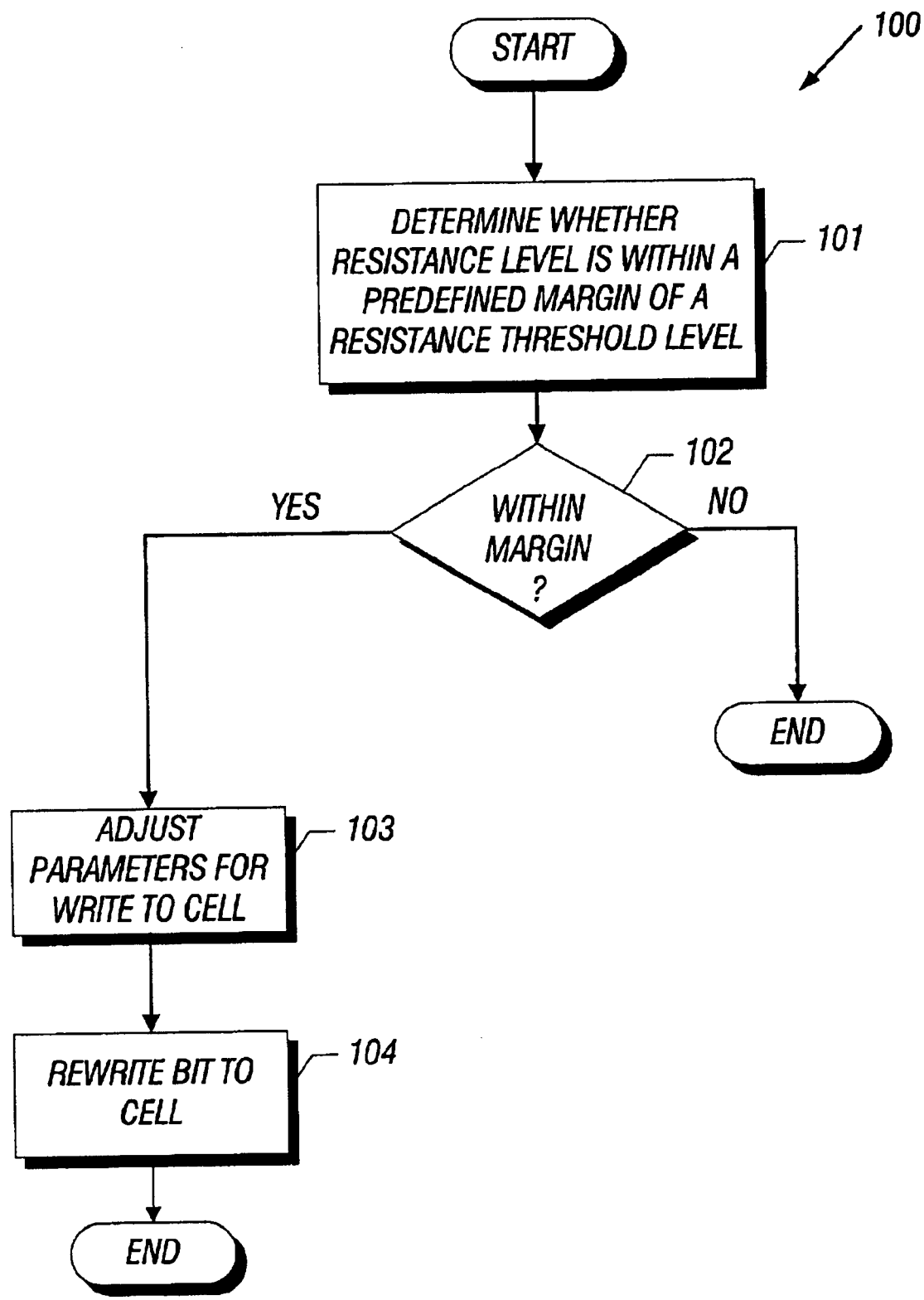
FIGS. 3 and 5 are flow diagrams depicting techniques to refresh a phase change memory cell according to embodiments of the invention.

Thus, it is possible that the resistance that is exhibited by the phase change memory cell to indicate a "1" or "0" bit may be too large (for the crystalline state) or too small (for the amorphous state) for a sufficient margin to exist between the exhibited resistance and a threshold resistance that defines the separation point between the amorphous and crystalline states. For purposes of curing this margin deficiency, in accordance with some embodiments of the invention, a memory device of the memory 32 may use a technique 100 that is depicted in FIG. 3 to refresh a particular memory cell. For purposes of simplifying the following discussion, it is assumed that a particular memory cell indicates two states. However, in other embodiments of the invention, a particular memory cell may indicate more than two memory states. However, regardless of the number of memory states, a margin deficiency between any two of the memory states may be cured by applying the refresh techniques described herein.

Figure 4:
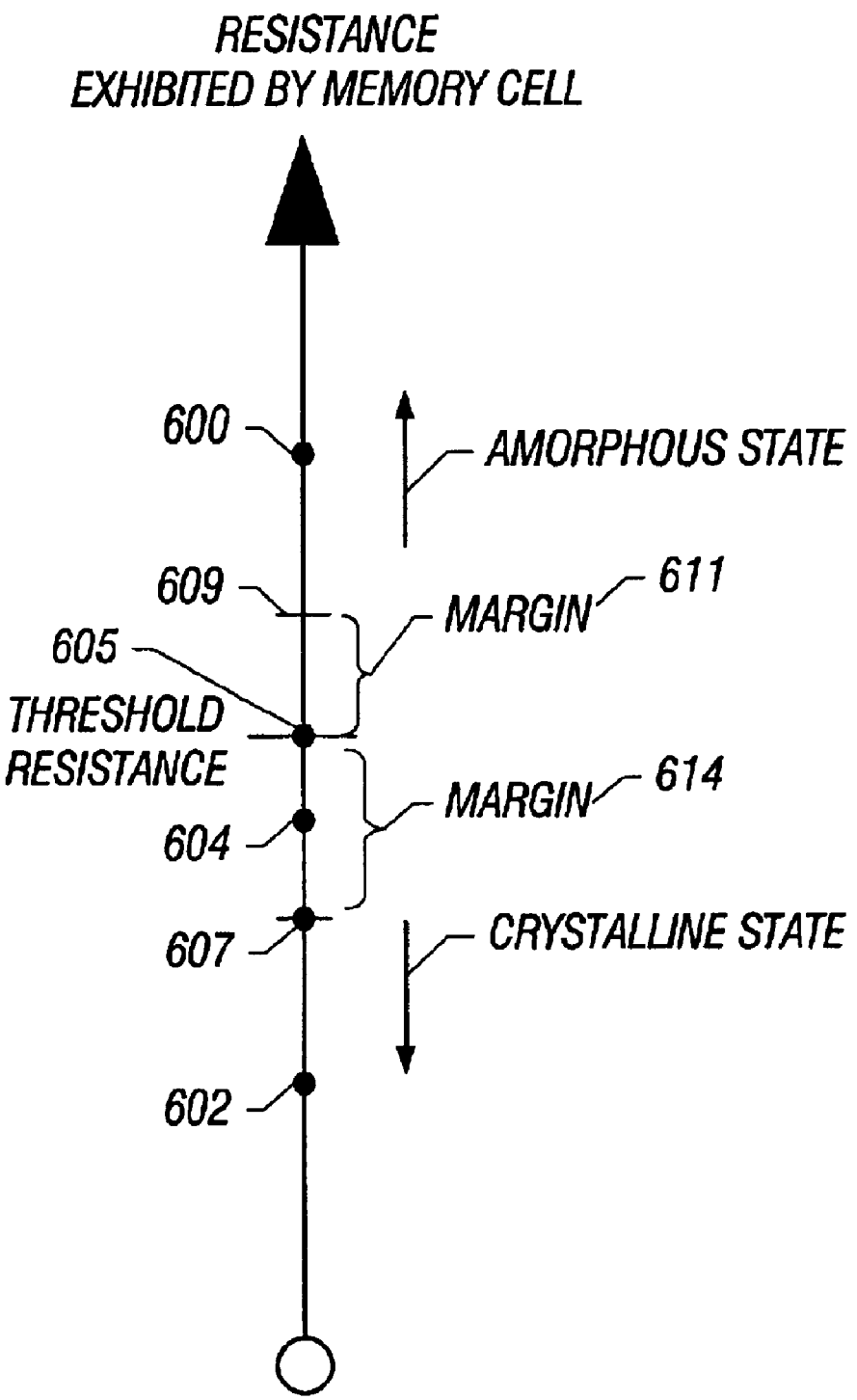
FIG. 4 is an illustration of a resistance exhibited by a phase change memory cell.

Referring to FIG. 3, pursuant to the technique 100, for purposes of performing a refresh of a particular memory cell, the memory device determines (block 101) whether the resistance level that is exhibited by the memory cell is within a predefined margin of a resistance threshold level that defines the transition point between the amorphous and crystalline states (i.e., the two states of the memory cell). For example, referring to FIG. 4, for exhibiting a resistance above a threshold resistance level 605, a particular cell is deemed to be in the amorphous state and thus, indicate a particular data bit (a "0" bit, for example). For exhibiting a resistance below the threshold resistance level 605, the cell is deemed to be in the crystalline state and thus, indicate a different data bit (a "1" bit, for example). As more specific examples, for a resistance 600, the cell is deemed to be in the amorphous state, and for a resistance 602, the cell is deemed to be in the crystalline state. For a resistance 604, the cell is in the crystalline state, but the resistance 604 is not outside of an acceptable margin from the threshold resistance level 605.

Referring back to FIG. 3, if the memory device determines (diamond 102) that the exhibited resistance is outside of the predefined margin, then the memory device does not perform the refresh. Otherwise, if within the margin, the memory device prepares to rewrite the memory cell with the current data bit that is indicated by the memory cell to refresh the cell's resistance. That is, if an amorphous state bit is higher in resistance than 605 but less than the resistance 609 of FIG. 4, then the margin 611 is inadequate and should be refreshed. Similarly, if a crystalline state bit is less than 605 but greater than 607 in FIG. 4, then the margin 614 is inadequate and should be refreshed.

In this manner, in this preparation, the memory device may adjust (block 103) the appropriate parameters for a write of a bit of data to the cell. As further described below, if the refresh is needed just after a bit of data has been written to the cell, then parameters of the set/reset pulse may need to be adjusted to ensure the subsequent rewrite that is involved with the refresh operation establishes the appropriate resistance for the cell. For example, if the cell is supposed to exhibit a low resistance that is associated with a "1" bit of data (for example) but instead exhibits a slightly higher resistance than expected, the slope of the trailing edge of the set current pulse that is used for the rewrite may be increased to ensure that the resistance of the cell is lowered. Similarly, if the cell is supposed to exhibit a high resistance that is associated with a "0" bit of data but instead exhibits a slightly lower resistance than expected, the magnitude of the reset current pulse may be increased in the rewrite to ensure that the cell is correctly reset. After adjustments (if any) are made to the parameters that are used to rewrite the bit, the bit is rewritten (block 104) to the cell to complete the refresh.

Alternately, instead of waiting for a bit to be read to determine if its margin is adequate, the chip can be periodically commanded to read all bits on the chip either gradually (interspersed with other reads or writes) or continuously. This intentional refresh can be done much like that in a DRAM, and might be done, for example, after every 1 hour of power up time (instead of every few milliseconds for a DRAM). The counting of time can be done on the chip (self-refresh) or externally in the system (by the computer's sequentially working through all bits on the chip). Alternately, the bits might be all read and refreshed if necessary whenever the chip is powered up.

Figure 5:
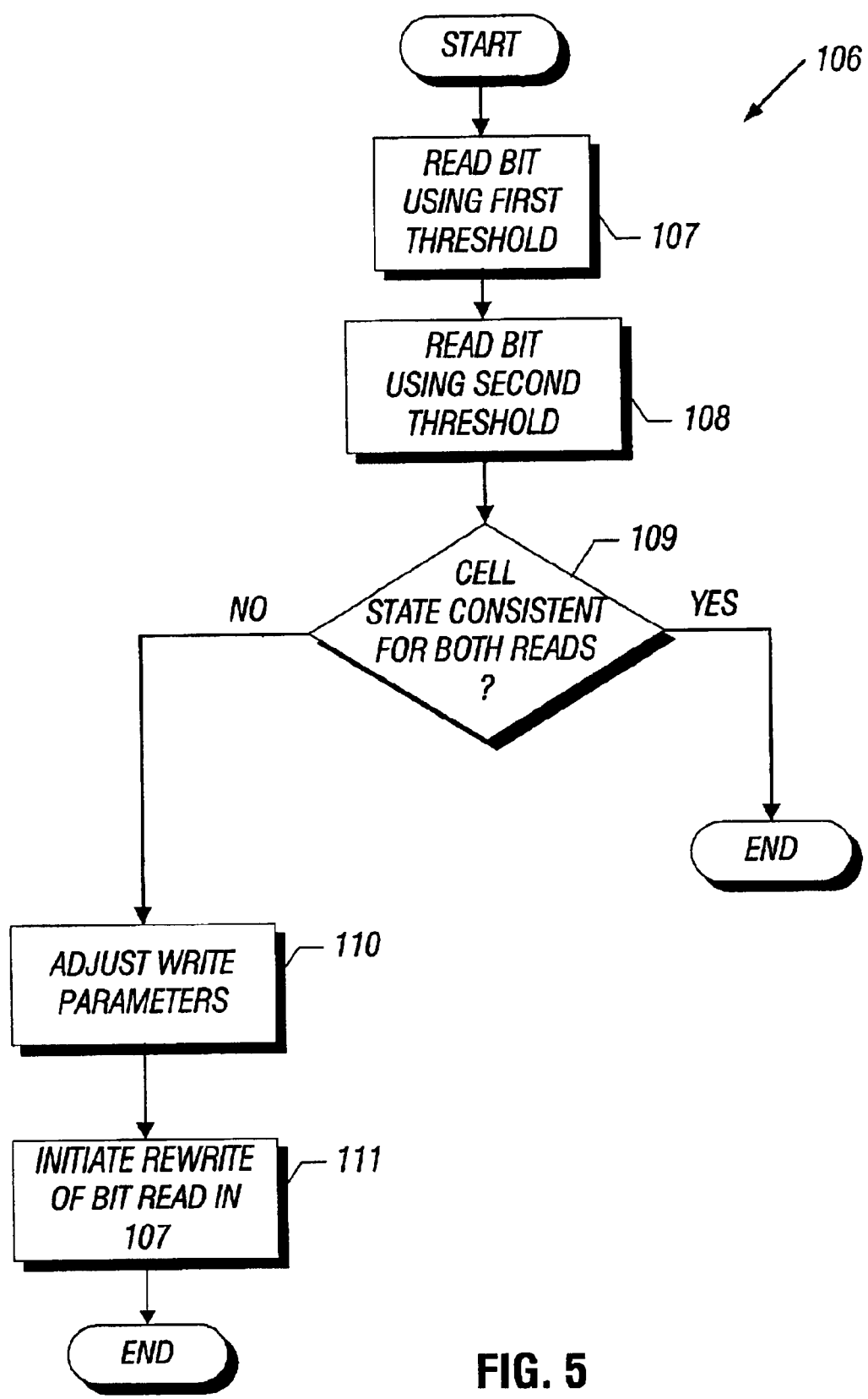

FIG. 5 depicts a more specific technique 106 that may be used by the memory device to refresh a particular memory cell. For purposes of determining whether a sufficient margin is present, the technique 106 includes performing two read operations with the memory cell: a first read operation (block 107) in which a first threshold is used to determine the state ("1" or "0") of the memory cell; and a second read operation (block 108) in which a second, more restrictive (lower margin) threshold is used to determine the state of the memory cell. In this manner, the first threshold is the resistance threshold that is used by the memory device in normal read operations and distinguishes the boundary between the crystalline and amorphous states during normal read operations. This threshold level is graphically depicted in FIG. 4 as being at reference numeral 605. A resistance margin should exist on both sides of the resistance threshold level 605. Alternately, during a read, multiple comparators may be used and the bit voltage simultaneously compared to the threshold (to determine if it is a 1 or 0) and also to the margin thresholds (to assure the cell reads with alternate margin). This avoids the delay of another read to determine if an additional write is needed to improve cell margin.

Determining whether the margin exists is accomplished by the read operation of block 108 in which a second threshold level is used. This second threshold level defines the boundary of the margin for the particular memory state detected in the read operation of block 107. For example, if the read operation in block 107 indicates the cell is in the amorphous state, a higher resistance threshold 609 (FIG. 4) is used in the read operation in block 108. The higher threshold 609 defines the boundary of a margin 611. If the read operation in block 107 indicates the cell is in the crystalline state, a lower resistance threshold 607 is used in the read operation in block 108. The lower threshold 607 defines the boundary of a lower margin 614.

As a more specific example, the margin that is established by the second threshold may be about a twenty percent variation (up or down, depending on the memory state detected by the read operation in block 107) from the first threshold, in some embodiments of the invention. Thus, if the bits read in both read operations 107 and 108 are determined (diamond 109) by the memory device to be consistent, a sufficient margin exists and no refresh occurs. Thus, if the bits are inconsistent in state for the different thresholds, a condition that indicates an insufficient margin, then the memory device performs a refresh of the memory cell by possibly adjusting (block 110) write parameters (as described above in connection with the technique 100) prior to initiating (block 111) the rewriting of the bit read in block 107. Avoiding unnecessary writes is desirable since field endurance is most significantly improved by reducing write cycles.

Figure 6:
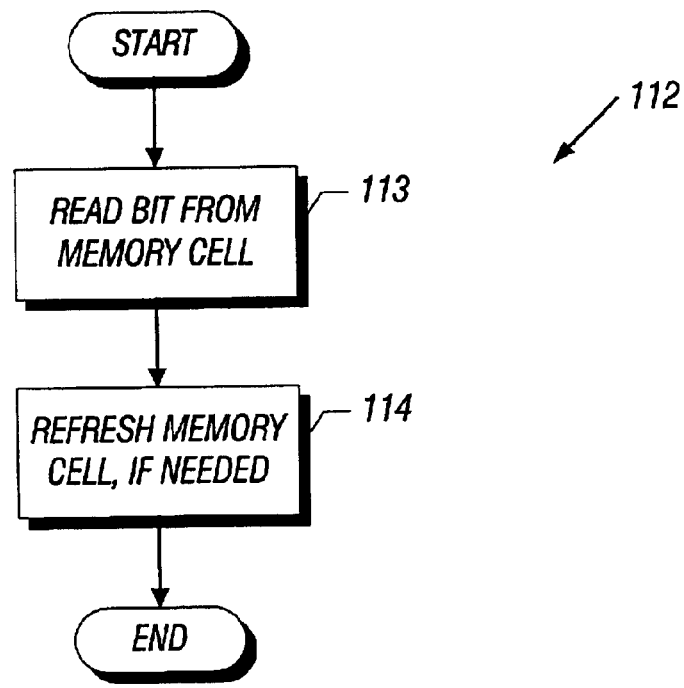
FIG. 6 is a flow diagram depicting a technique to read a bit of data from a phase change memory cell according to an embodiment of the invention.

The above-described refresh techniques 100 and 106 may be used in a variety of different scenarios. For example, referring to FIG. 6, in some embodiments of the invention, the memory device may perform a technique 112, a technique in which, in response to the memory device reading (block 113) a bit from a memory cell, the memory device refreshes (block 114) the memory cell if sufficient margin exists between the cell's exhibited resistance and the threshold resistance used for normal read operations.

Figure 7:
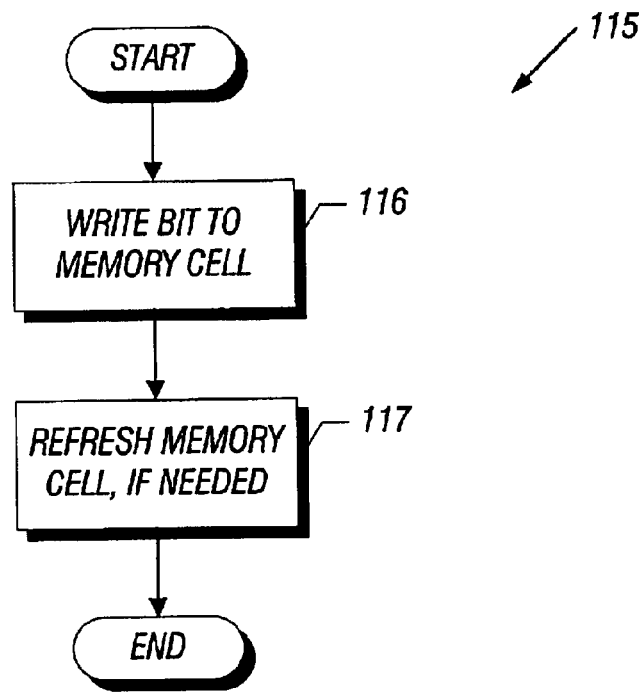
FIGS. 7 and 8 are flow diagrams depicting techniques to write a bit of data to a phase change memory cell according to embodiments of the invention.

FIG. 7 depicts a technique 115 that the memory device performs in some embodiments of the invention. In the technique 115, the memory device, in response to writing (block 116) a particular bit to a memory cell, refreshes (block 117) the memory cell if sufficient margin exists between the cell's exhibited resistance and the threshold resistance used for normal read operations.

Figure 8:
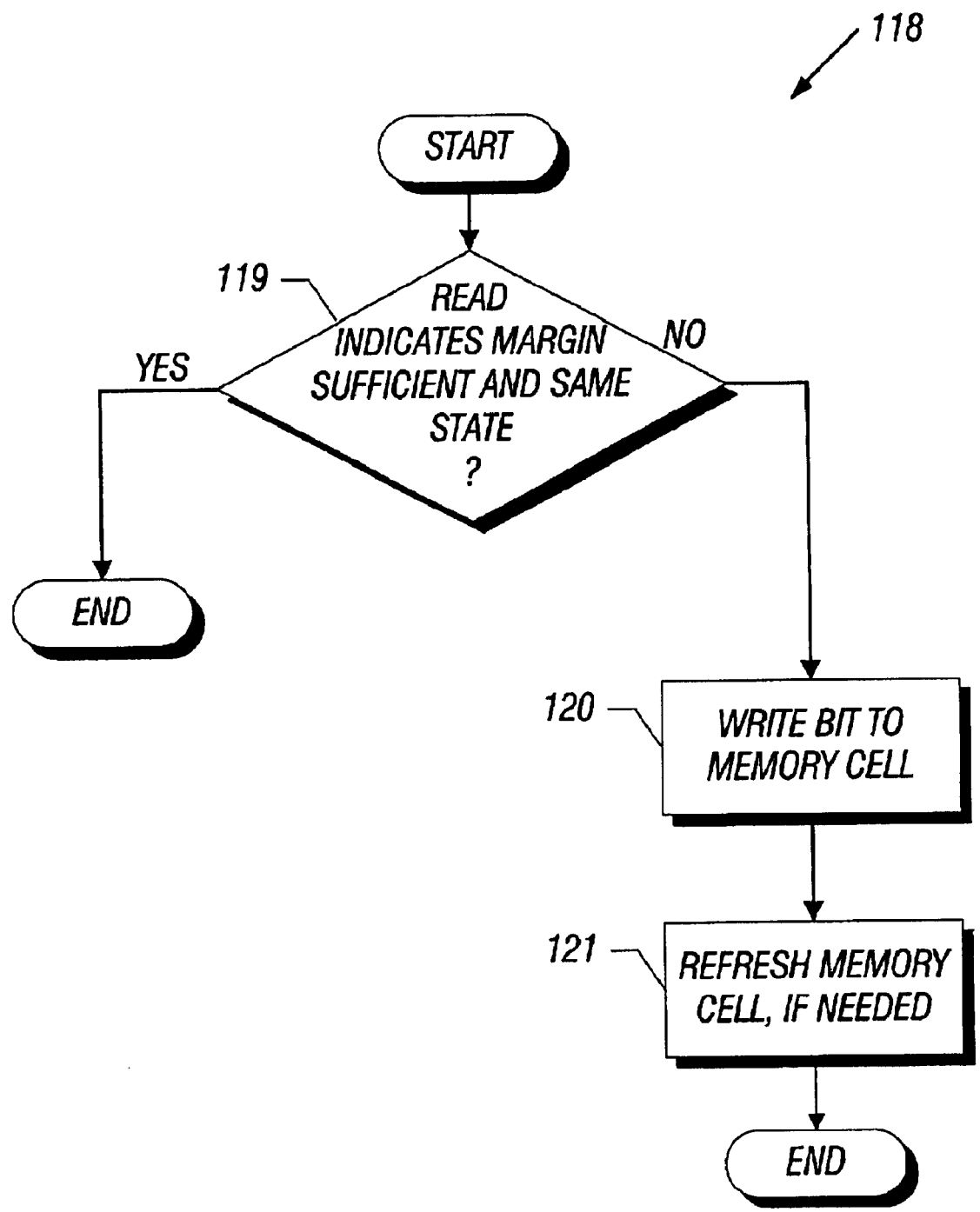

FIG. 8 depicts another technique 118 that the memory device performs in connection with a write operation to a particular memory cell, in some embodiments of the invention. In the technique 118, the memory device determines (diamond 119) whether both the memory state of the memory cell is consistent with the bit of data to be written to the memory cell and a sufficient margin exists between the cell's exhibited resistance and the threshold resistance used for normal read operations. If this condition is true, then the memory device does not perform the write operation to the memory cell, as the correct bit is already stored in the memory cell and sufficient margin exists. Otherwise, the memory device writes (block 120) the new bit to the memory cell and refreshes (block 121) the memory cell if needed to ensure a sufficient margin exists between the cell's exhibited resistance and the threshold resistance used for normal read operations.

Figure 9:
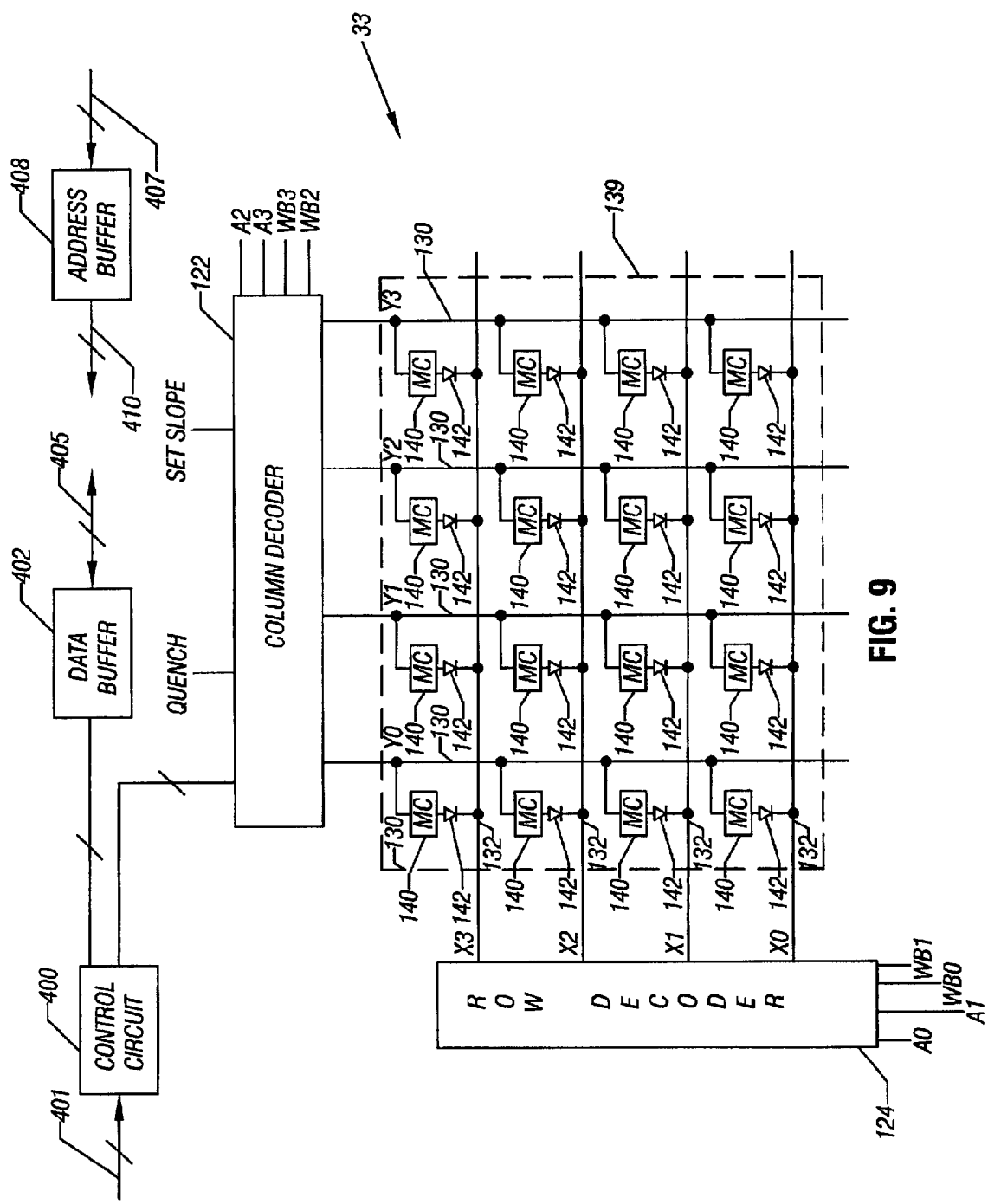
FIG. 9 is a schematic diagram of a phase change material memory device according to an embodiment of the invention.

FIG. 9 depicts a particular memory device 33 of the memory 32 in accordance with some embodiments of the invention. The specific structure of the memory device 33 is depicted for purposes of describing some out of many possible embodiments of the invention. It is understood that other and different structures may be used, as the scope of the invention is defined by the appended claims. The memory device 33 may perform one or more of the techniques described above in connection with FIGS. 3 and 5–8.

As a further improvement to experienced reliability in actual field operation (though not in worst case testing), the memory device 33 may be programmed to first read a bit before writing it. If the bit is already in the desired state to be written, the write cycle is skipped (but only if the margin is still adequate). This will improve field reliability because reliability for a given bit is often related to the total number of write cycles it experiences. For field requests to program a bit to a state that the bit is already in as determined by a pre-read before write, ignoring that request after reading and confirming margin will improve reliability since a read operation has far less effect on experienced field reliability compared to a write operation.

In some embodiments of the invention, to determine the optimum write current for reset, the minimum reset current necessary to write bits in a block may be logged by total or by percentage. Once a certain number is exceeded, thereafter the minimum reset current attempted for a reset or set shall be increased to this level. Preferably, the reset current will start at this minimum level and, especially for trying to reset the bit, the current will be increased in small increments until the bit is satisfactorily written with adequate margin.

Figure 14:
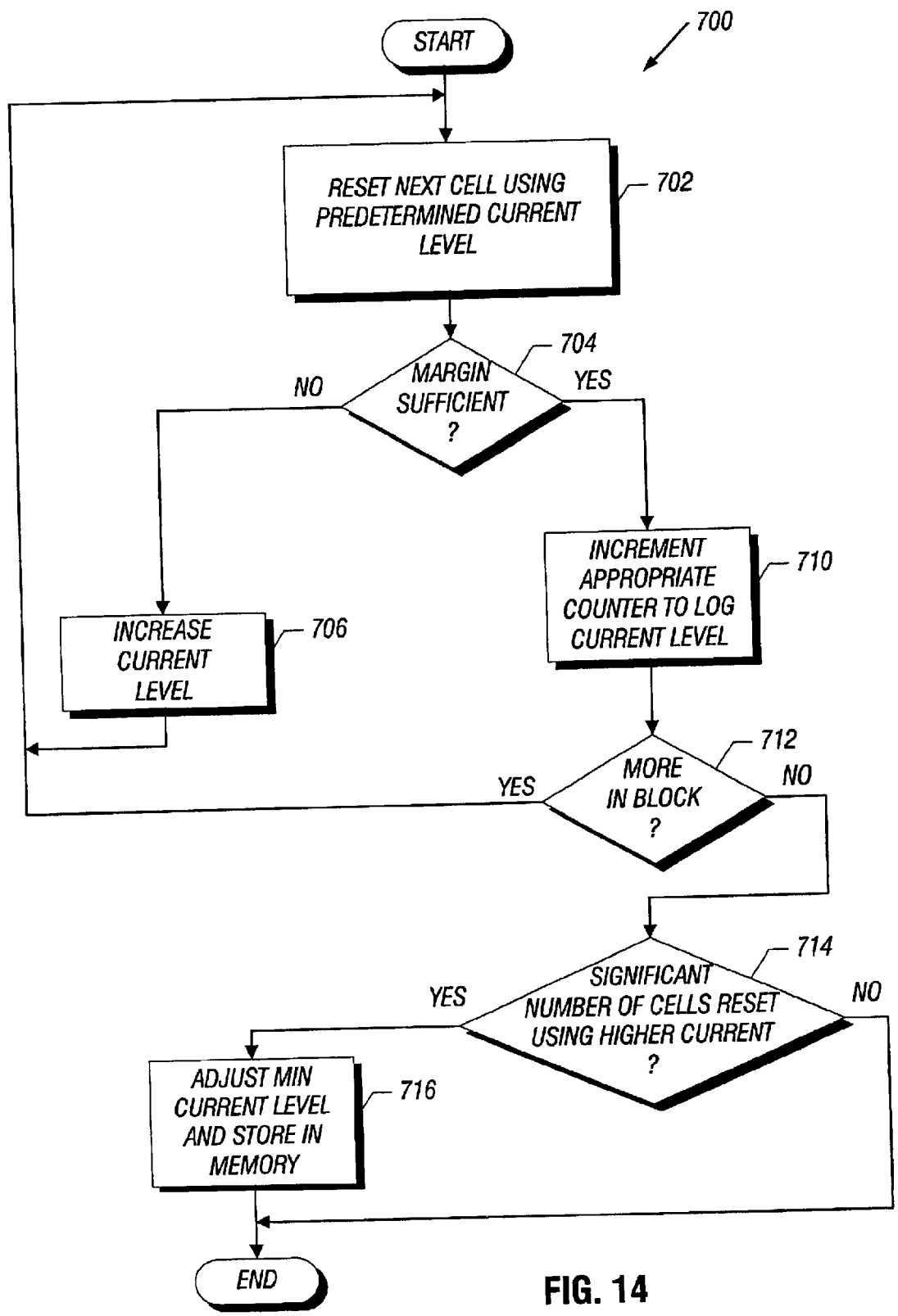
FIG. 14 is a flow diagram depicting a technique to determine a current to be used for write reset operations according to an embodiment of the invention.

In some embodiments of the invention, a technique 700 that is depicted in FIG. 14, may be used to determine the current level to be used for resetting cells of a particular block. The term "block" refers to the smallest section of the memory device that shares a threshold sensor (a comparator, for example). In the technique 700, the memory device 33 resets (block 702) the next cell in the block using a predetermined current level for the reset operation. For each initial attempt to reset a particular cell and establish an acceptable margin for the cell, the reset current level is set to a minimum level and thereafter upwardly adjusted for subsequent attempts, as described below. As described below, the minimum reset current may be adjusted after all cells of the block are written.

After resetting (block 702) the next cell, the memory device 33 determines (diamond 704) whether there is a sufficient margin after the reset operation. If not, the memory device 33 increases (block 706) the current level and returns to block 702. Otherwise, the memory device 33 increments (block 710) an appropriate counter to log the current reset current level and then determines (diamond 712) whether another cell in the block needs to be reset. In this manner, the memory device 33 may include counters 409 (see FIG. 9), each of which is associated with a particular reset current range. By incrementing the appropriate counter, the current that is sufficient to reset a particular cell and ensure the cell has an appropriate margin is logged. In this manner, by examining the log of currents used to reset the cells in a particular block, the memory device 33 may then base a decision of whether to increase the minimum reset current level. For example, the memory device 33 may determine (diamond 714) whether a significant number of cells have been reset using a current that is higher than the minimum current level. If so, then the memory device 33 adjusts (block 716) the minimum current level for reset operations and stores this in a predefined location in the memory device 33. For example, this predefined location may be a row of their only accessible by a control circuit 400 (FIG. 9) of the memory device 33.

A preferred sequence may be to perform a write reset operation at current X, and then read to be sure that the reset operation is done with adequate margin. If not, the cell is written at (1.1)X, and then read to determine if adequate margin. If there is not an adequate margin, then the cell is written at (1.2)X, read again, etc. Hence the reset becomes a series of reset sweeps of increasing current until the bit is written with adequate margin. The successful current is logged by incrementing a counter for that current. When enough bits are writing at a higher current (adding all the currents of higher value), the lowest starting current is incremented for future writes. This information can be stored in the non-volatile phase change memory in a special row accessed by the memory device 33 and not by the user (other than for test purposes).

Figure 15:
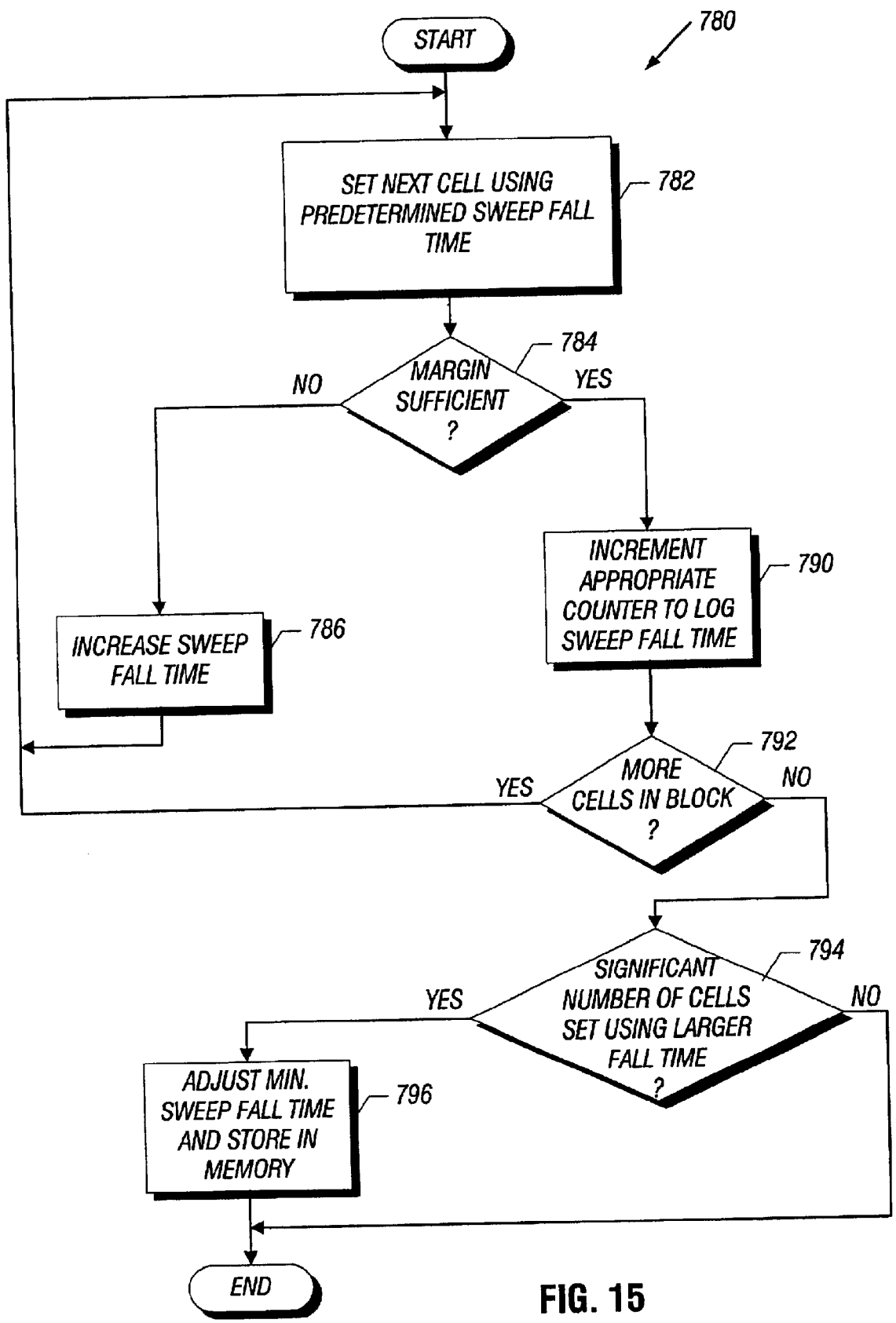
FIG. 15 is a flow diagram depicting a technique to determine a sweep fall time to be used for write set operations according to an embodiment of the invention.

Similar to the setting of the reset current, a technique 780 that is depicted in FIG. 15 may be used to establish a minimum fall sweep time for a write set operation. In the technique 780, the memory device 33 sets (block 782) the next cell in a block using a predetermined sweep fall time. For each initial attempt to set a particular cell and establish an acceptable margin for the cell, the sweep fall time is set to a minimum time and thereafter upwardly adjusted, as described below. As described below, the minimum time may be adjusted after all cells of the block are written.

Next in the technique 780, the memory device 33 determines (block 784) whether the margin is sufficient. If not, the sweep fall time is increased (block 786), and control returns to block 782. Otherwise, the memory device 33 increments (block 790) an appropriate counter 409 (FIG. 9) to log the sweep fall time. If the memory device 33 determines (diamond 792) that more bits are in the block to process, then control returns to block 782. Otherwise, the memory device 33 determines (diamond 794) whether a significant number of bits have been written using sweep fall times greater than the minimum sweep fall time. If so, then the memory device 33 adjusts (block 796) the sweep fall time and stores it in the memory accessible by the control device 419.

Thus, a particular set begins at the current minimum reset current level. As a more specific example, if a write is unsuccessful, the set sweep fall is increased time by 20%. If this is unsuccessful, the set current is increased by 20%, and then the set operation is repeated at the higher set sweep time. As noted above, a counter 409 is incremented to reflect the successful current if greater than minimum. Similarly, the set sweep counter 409 is incremented if the amount of set sweep time is increased. For chips in which the set level is achieved not by an increased fall time, but by a fast fall time and using a peak current level significantly less than the reset peak current, the magnitude of this current is varied in a binary or linear search using currents successively less than 1 reset until a current is found that sets the resistance in read mode in the desired range. Once the desired current is found, a counter may be incremented so a more intelligent starting current may be defined for that block or chip, perhaps starting the initial current at 150 percent of the most frequent successful Iset current, and indexing lower from there. This technique is most preferable when writing multiple levels into the cell.

In some embodiments of the invention, at the factory, the chip is scanned by block (the smallest section of memory that shares a threshold sensor). The minimum reset current is found that successfully writes all bits in the array with adequate margin. This current is then increased an adequate amount, preferably about 20% for subsequent writes in that block. Similarly, the minimum set sweep slope is then found using this chosen value of reset current that will set all bits in the block. Then, this slope is increased preferably by 50% to assure adequate margin for setting bits. Preferably, both set sweep slope fall time and reset current are checked at the factory at both high and low temperatures. This procedure is followed for all blocks on the chip, in some embodiments of the invention.

The memory device 33 includes memory cells 140 that are addressed via column lines 130 and row lines 132, as can be appreciated by those skilled in the art. Each memory cell 140 includes a phase change material whose state is controlled by write preset/set cycles to store an associated bit of data.

Although a 4×4 block 139 of the memory cells 140 is depicted in FIG. 9, it is understood that this array size is used to simplify the proceeding discussion. Thus, the memory device 33 may have a significantly larger or smaller array of memory cells 140.

As can be seen from FIG. 9, each memory cell 140 is associated with a particular column line 130 (also called a "bit line") and a particular row line 132, and the activation of the associated column 130 and row 132 lines selects the cell 140 for a write or read operation. In this manner, the memory cell 140 may be coupled to its associated column line 130 and may be coupled through what is effectively a diode 142 (preferably a PNP bipolar junction transistor (BJT) where size is important, for example) to its associated row line 132. Therefore, when a particular memory cell 140 is selected, its associated column line 130 is driven high and its associated row line 132 is driven low, a condition that causes a current pulse to flow through the memory cell 140. It is the magnitude and duration of this current pulse that establishes whether the selected memory cell 140 is being read, set (via a write set pulse) or reset (via a write reset pulse).

In response to address signals (called A0, A1, WB0 and WB1), the row decoder 124 selects one, two or four row lines 132. In this manner, the row decoder 124, in response to these address signals, selectively drives row select signals (called X0, X1, X2 and X3) low to select one or more of the row lines 132. As an example, a certain combination of the address signals may cause the row decoder 124 to select two of the row lines, another combination of the address signals may cause the row decoder 124 to select one of the row lines 132, another combination of the address signals may cause the row decoder 124 to select four of the row lines 132, etc. When the row decoder 124 drives the row line(s) 132 low, this enables a read or write cycle to occur to one or more memory cells 140, depending on the selections by the column decoder 122.

The column decoder 122, in response to its received address selection signals (called A2, A3, WB3 and WB2) drives column select signals (called Y0, Y1, Y2 and Y3) high to select one or more column lines 130. In this manner, when one of the column select signals is driven high, the corresponding column line 130 has been selected. Similar to the row decoder 124, the column decoder 122 may select one, two or four column lines 130. Thus, the selection of the column line(s) by the column decoder 122 and the row line(s) 132 by the row decoder 124 addresses selected memory cells 140 and may be used to address a block of the memory cells 140.

For purposes of controlling the time profiles currents that are used to set and reset the selected memory cells 140, the column decoder 122 receives signals called QUENCH and SET_SLOPE. The SET_SLOPE signal establishes a trailing slope(s) for set pulse(s) that set selected particular memory cells(s). In this manner, when the SET_SLOPE signal is asserted (driven high, for example) during a write set cycle, the column decoder 122 imparts a trailing edge on the set pulse, as described further below, that is preferably greater than 500 nsec for the trailing edge fall time. Conversely when the set SLOPE signal is de-asserted (driven low, for example) during a write reset cycle, the column decoder 122 does not add this trailing edge, resulting in a reset bit by quickly terminating the reset current with a trailing edge that is preferably less than 10 nsec.

The QUENCH signal is used to control the time at which the set or reset pulse ends. In this manner, in response to the QUENCH signal being asserted (driven high, for example), the column decoder 122 ends the current reset/set pulses. Conversely, in response to the QUENCH signal being deasserted, the column decoder 122 allows the current reset or set pulses (if occurring) to continue. Thus, the QUENCH signal may be used to end the slope established by the SET_SLOPE signal during a write set cycle once it has passed the critical set slope crystallization current (about 30% of the current required to reset a bit).

The address signals that are received by the row 124 and column 122 decoders may be used in a variety of different ways to select the memory cells 140. As an example of at least one possible embodiment, FIG. 10 depicts a truth table 110 that illustrates the selection of the row select signals X0, X1, X2 and X3 in response to various states for the address decode signals A0, A1, WB0 and WB1. As shown, when all of the address signals are driven low (indicated by the "L" state), then the row decoder 120 drives only the X3 row select signal to select one corresponding row line 132. Other individual row lines 132 may be selected by combinations of the A0 and A1 signals, as depicted in rows 1–4 of the truth table 110. For these selections by the A0 and A1 signals, it is noted that the WB0 and WB1 signals are driven low. Rows 5 and 6 of the truth table 110 depict combinations possible when the WB0 signal is driven high and the WB1 signal is driven low. As shown, for these states, two row lines 132 are selected, and the two particular row lines that are selected depend on the state of the A1 signal. When both the WB0 and WB1 signals are driven high, then all of the row lines 132 are selected, as depicted in line 7 of the truth table 110. Other combinations may be used to select the rows 132.

Figure 11:
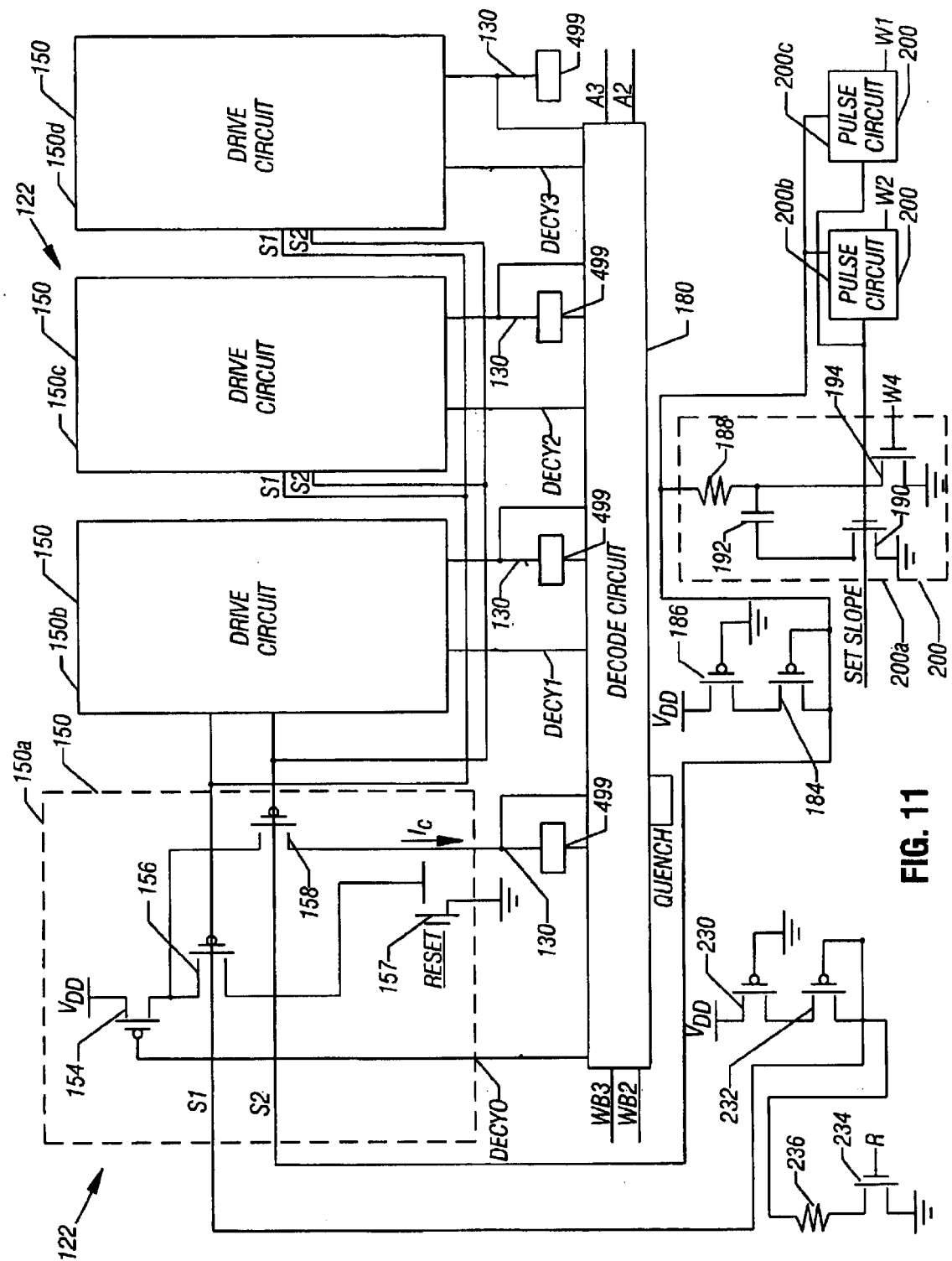
FIG. 11 is a schematic diagram of a column decoder of the phase change material memory device of FIG. 9 according to an embodiment of the invention.

FIG. 11 depicts one out of many possible embodiments for the column decoder 122. In this manner, in some embodiments of the invention, the column decoder 122 includes drive circuits 150 (drive circuits 150a, 150b, 150c and 150d, as examples), each of which is associated with a different column line 130. A particular drive circuit 150 is activated for purposes of selecting and reading/writing data from one or more cells 140 of its associated column line 130 in response to a signal that is provided by a decode circuit 180. More particularly, the decode circuit 180 receives the column address signals A2, A3, WB2 and WB3 and furnishes decode signals called DECY0, DECY1, DECY2 and DECY3 that are used to activate the decode circuits 150a, 150b, 150c and 150d, respectively. As an example, the drive circuit 150a is activated in response to the assertion of the DECY0 signal by the decode circuit 180.

In some embodiments of the invention, the drive circuit 150 may have the circuitry that is illustrated in FIG. 11 for the drive circuit 150a. In particular, the drive circuit 150 may include a P-channel metal-oxide-semiconductor field-effect-transistor (PMOSFET) 154 that has its source terminal coupled to a positive voltage supply (called VDD) and its drain terminal coupled to the source terminal of a PMOSFET 158. The drain terminal of the PMOSFET 158, in turn, is coupled to the column line 130 that is associated with the drive circuit 150.

The gate terminal of the PMOSFET 154 receives the corresponding decode signal (DECY0, DECY1, DECY2 or DECY3) from the decode circuit 180. As an example, for the drive circuit 150a, the gate terminal of the PMOSFET 154 receives the DECY0 signal. When this signal is asserted (driven high, for example) the source-drain path of the PMOSFET 154 conducts a current that, in a write cycle, is established by the PMOSFET 158. In this manner, the gate terminal of the PMOSFET 158 receives a current sense signal (called S2) that establishes the current through the source-drain path of the PMOSFET 154, the source-drain path of the PMOSFET 158 and the current that flows into the associated column line 130. Thus, the source-drain paths of the PMOSFETs 154 and 158 are serially coupled together with the column line 130 during the write operation.

As described below, depending on the number of memory cells that are selected along a particular column line 130, the column decoder 122 adjusts the magnitude of the S2 signal so that each activated drive circuit 150 provides more current to its associated column line 130 when two memory cells 140 per selected column line 130 are being written than when one memory cell 140 per selected column line 130 is being written. Furthermore, in response to the selection of four memory cells 140 per column line 130, the column decoder 122 adjusts the magnitude of the S2 signal so that more current is applied to the selected column line 130 than when one or two memory cells per selected column line 130 are being written.

For read operations, the drive circuit 150 includes a PMOSFET 156 to route the read current to the associated column line 130. In this manner, the source terminal of PMOSFET 156 is coupled to the drain terminal of the PMOSFET 154, and the drain terminal of the PMOSFET 156 is coupled to the column line 130 that is associated with the drive circuit 150. The gate terminal of PMOSFET 156 receives a current sense called S1. In this manner, similar to the S2 signal, the column decoder 122 adjusts the magnitude of the S1 signal to adjust the level of current that flows through the associated column line 130 during a read operation, as the source-drain of the PMOSFET 156 is coupled in series with the drain-source path of the PMOSFET 154 and the column line 130.

Each drive circuit 150 may also include an NMOSFET 157 that has its drain-source path coupled between the associated column line 130 and ground. The gate terminal of the NMOSFET 157 receives a reset signal (called RESET), a signal that is asserted (driven high, for example) after a read operation to discharge energy stored due to the capacitance of the column line 130.

Although an example of a detailed schematic diagram for the drive circuit 150*a* is depicted in FIG. 11, the other drive circuits 150*b*, 150*c* and 150*d* may have similar designs, in some embodiments of the invention. Other designs are possible for the drive circuit 150, in other embodiments of the invention.

To generate and control the S2 signal, in some embodiments of the invention, the column decoder 122 includes the following circuitry. This circuitry includes a PMOSFET 186 that has its gate terminal coupled to ground. The source terminal of the PMOSFET 186 is coupled to a positive supply voltage (called VDD), and the drain terminal of the PMOSFET 186 is coupled to the source terminal of a PMOSFET 184. The gate and drain terminals of the PMOSFET 184 are coupled together to furnish the S2 signal. These terminals are also coupled to one terminal of a resistor 188. The other terminal of the resistor 188 is coupled to the drain terminal of an N-channel MOSFET (NMOSFET) 194 that has its source terminal coupled to ground. The gate terminal of the NMOSFET 194 receives a signal called W4.

Thus, due to this arrangement, when the W4 signal is asserted, the NMOSFET 194 conducts, as determined by the resistance of the resister 188, a current that flows through the PMOSFETs 184 and 186. This current, in turn establishes the level of the S2 signal that, in turn, establishes the current that flows through the selected column lines 130.

The resistor 188 and the NMOSFET 194 are part of a pulse circuit 200. In this manner, in some embodiments of the invention, the column decoder 122 includes three such pulse circuits 200*a*, 200*b* and 200*c*. The differences between the pulse circuits 200 are established by the value of the resistance 188 and the signal received at the gate terminal of the NMOSFET 194. In this manner, the slope circuit 200*b* receives a signal called W2, and the slope circuit 200*c* receives a signal called W1.

When only one memory cell 140 is to be written per selected column line 130, only the WI signal is asserted, and as a result, the pulse circuit 200*c* is used to set the current through the column line 130. However, if two memory cells 140 are to be written per selected column line 130, then both the W1 and W2 signals are asserted (driven high, for example) to cause twice the level of current to flow than when one memory cell 140 per column line 130 is written through the select column line 130. If four memory cells 140 per column are to be written, then the W1, W2, and W4 signals are all asserted (driven high, for example) to cause additional current to flow through the selected column lines 130. The resistances of the resistors 188 in each of the pulse circuits 200 have the appropriate values to implement the necessary binary weighting of the current among the pulse circuits 200.

For purposes of establishing the trailing edge of the set pulse, in some embodiments of the invention, each pulse circuit 200 includes an NMOSFET 190 and a capacitor 192. In this manner, the gate terminal of the NMOSFET 190 receives the SET_SLOPE signal, and the source terminal of the NMOSFET 190 is coupled to ground. The drain terminal of the NMOSFET 190 is coupled to one terminal of the capacitor 192, and the other terminal of the capacitor 192 is coupled to the drain terminal of the MOSFET 194.

Due to this arrangement, when a write set cycle is performed, the SET_SLOPE signal is asserted to cause both terminals of the capacitor 192 to be coupled to ground. Therefore, when the MOSFET 194 de-activated, the capacitor 192 introduces a time constant to produce the trailing edge of the set pulse. The end of the set pulse may be controlled via the assertion of the QUENCH signal to terminate the cycle early to save write time.

The reset pulse is created by leaving the SET_SLOPE signal unasserted and the end of the reset pulse is controlled via the QUENCH signal, preferably using an undecoded n-chan pulldown on each column to rapidly pull the column to ground to assure rapid termination of the write cycle trailing edge in under 10 nsec.

To generate the S1 signal to establish the read current, the column decoder 122 includes a PMOSFET 230 that has its source coupled to the VDD supply voltage and its gate terminal coupled to ground. The drain terminal of the PMOSFET 230 is coupled to the source terminal of a PMOSFET 232. The gate and drain terminals of the PMOSFET 232 are coupled to one terminal of a resistor 236 and furnish the S1 signal. The other terminal of the resistor 236 is coupled to the drain terminal of an NMOSFET 234, and the source terminal of the NMOSFET 234 is coupled to ground. The gate terminal of the NMOSFET 234 receives a signal (called R) that is asserted (driven high, for example) in response to a read operation. Thus, during a read operation, the read mirror formed from the PMOSFETs 230 and 232 forms (via the S1 signal) a read current in selected column line(s) 130.

Figure 12:
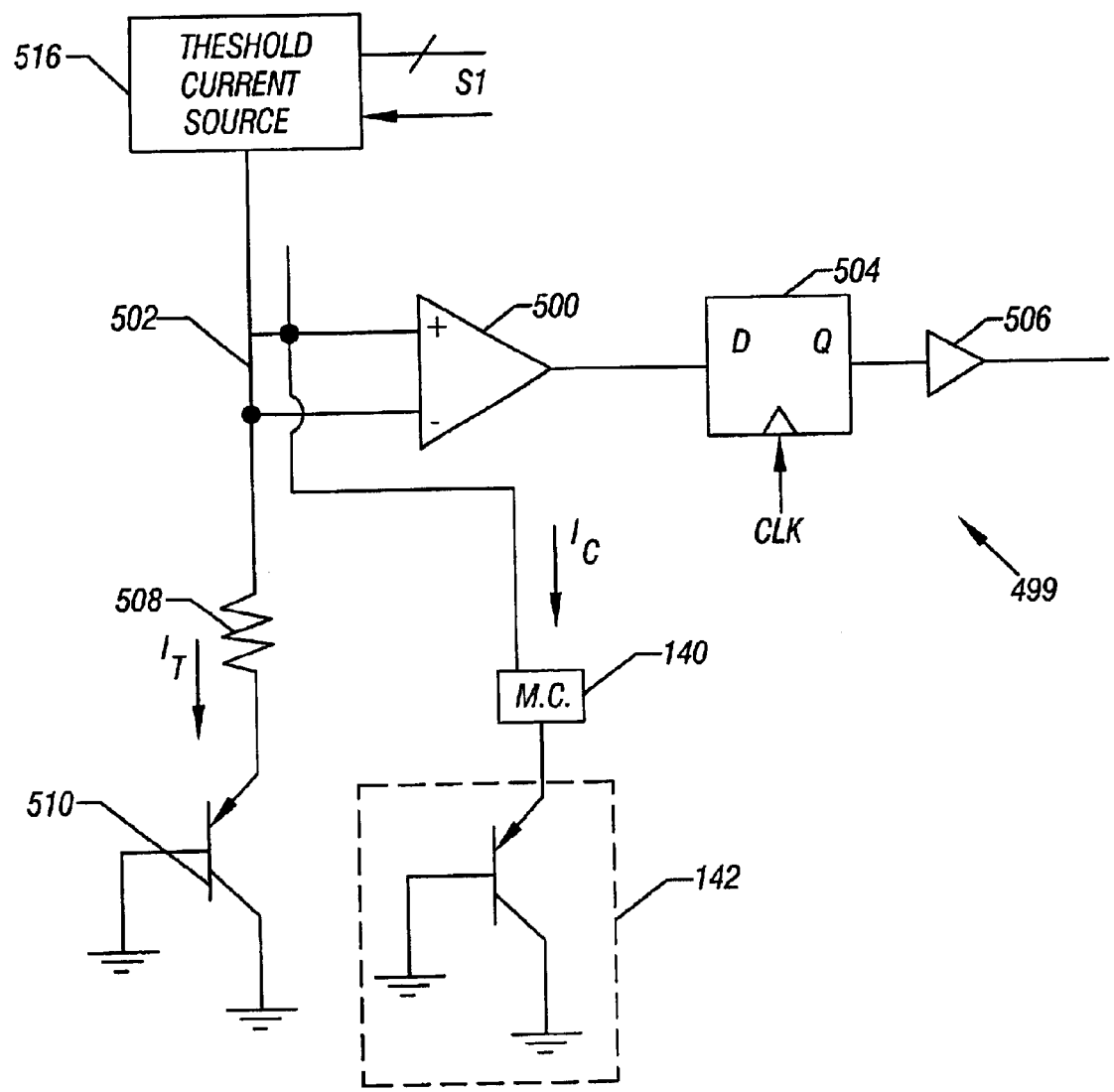
FIG. 12 is a schematic diagram of read path circuitry for a particular column line according to an embodiment of the invention.

Each bit, or column line 130, is coupled to associated read path circuitry 499 that is used by the memory device 33 to detect and store a bit of data that appears on the column line 130 during a read operation. Referring to FIG. 12, in some embodiments of the invention, the read path circuitry 499 includes a comparator 500 to, in response to a read operation, compare the resistance exhibited by the associated memory cell 140 with a resistive threshold that is established by a threshold current source 516 and a resistor 508. The non-inverting input terminal of the comparator 500 is be coupled to the column line 130, and the inverting input terminal of the comparator 500 is coupled to a current communication line 502 that conducts a current (called $I_T$) that is furnished by the threshold current source 516.

One terminal of the resistor 508 is coupled to the current line 502, and the other terminal of the resistor 508 is coupled to the emitter terminal of a PNP BJT 510. The base terminal of the BJT 510 is coupled to ground, and the collector terminal of the BJT 501 is coupled to ground. Due to this arrangement, the BJT 510 effectively forms a diode between the resistor 508 and ground.

Thus, due to the above-described arrangement, the non-inverting input terminal of the comparator 500 receives an indication of the voltage across the memory cell 140, and the inverting input terminal of the comparator 500 receives an indication of the voltage across the resistor 508. The voltage drop across the diode 142 is canceled out by the voltage drop across the BJT 510 in the comparison formed by the comparator 500.

Due to this arrangement, the comparator 500 effectively compares a resistive threshold (indicated by the voltage at the inverting input terminal produced by the product of the $I_T$ current and the resistance of the resistor 508) with the resistance of memory cell 140 (indicated by the voltage (at the non-inverting input terminal) that is produced by the resistance exhibited by the memory cell 140 and a read current (called $I_C$) that flows through the column line 130 during a read operation).

Thus, the resistance threshold may be changed by either changing the $I_T$ current or by changing the value of the resistance 508. In some embodiments of the invention, the threshold current source 516 (under the control of the control circuit 400 (FIG. 9) of the memory device 33 via control lines 514) regulates the resistance threshold by regulating the level of the $I_T$ current.

In this manner, to perform a read operation on a particular memory cell 140, the threshold current switch 516 may set the level of the $I_T$ current to the same level as the $I_C$ current. Thus, if the resistance of the resistor 508 is located somewhere between the high amorphous state resistance and low crystalline state resistance, the inverting input terminal of the comparator 500 is set somewhere between the low and high voltages present at the non-inverting input terminal of the comparator 500. As a result of this arrangement, for the highly resistant amorphous state of the memory cell 140, the comparator 500 asserts its signal to indicate a "0" bit (for example), and for the crystalline state of the memory cell 140, the comparator 500 de-asserts its output signal to indicate another memory state (i.e., the "1" bit).

For purposes of determining whether significant degradation of the resistance exhibited by the memory cell 140 has occurred, in some embodiments of the invention, the threshold current source 516 increases or decreases the $I_T$ current appropriately to change the resistive threshold. For example, if in a read operation in which the $I_T$ and $I_c$ current levels are approximately the same, the comparator 500 detects an amorphous state for the memory cell 140 during the read operation 107 (FIG. 5), then the threshold current source 516 may be used (under the control of the control circuit 400) to increase the threshold by increasing the $I_T$ current in the subsequent read operation 108 (FIG. 5). Similarly, if the comparator 500 detects a crystalline state for the memory cell 140 in the read operation 107 (FIG. 5), the threshold current source 516 may be controlled by the control circuit 400 to decrease the $I_T$ current to effectively decrease the resistant threshold during the subsequent read operation 108 (FIG. 8).

Other variations are possible. For example, besides manipulating the $I_T$ current level to change the resistance threshold, other parameters may be varied, such as the resistance of the resistor 508, for example. One skilled in the art may choose to compare the cell to the conventional (centered) threshold (605 in FIG. 4) and simultaneously compare it to the higher and lower thresholds (using 3 parallel comparators) to avoid delay. The logical comparisons of the outputs will allow the chip to determine if a refresh is needed (or a modified write cycle to improve margin).

Figure 13:
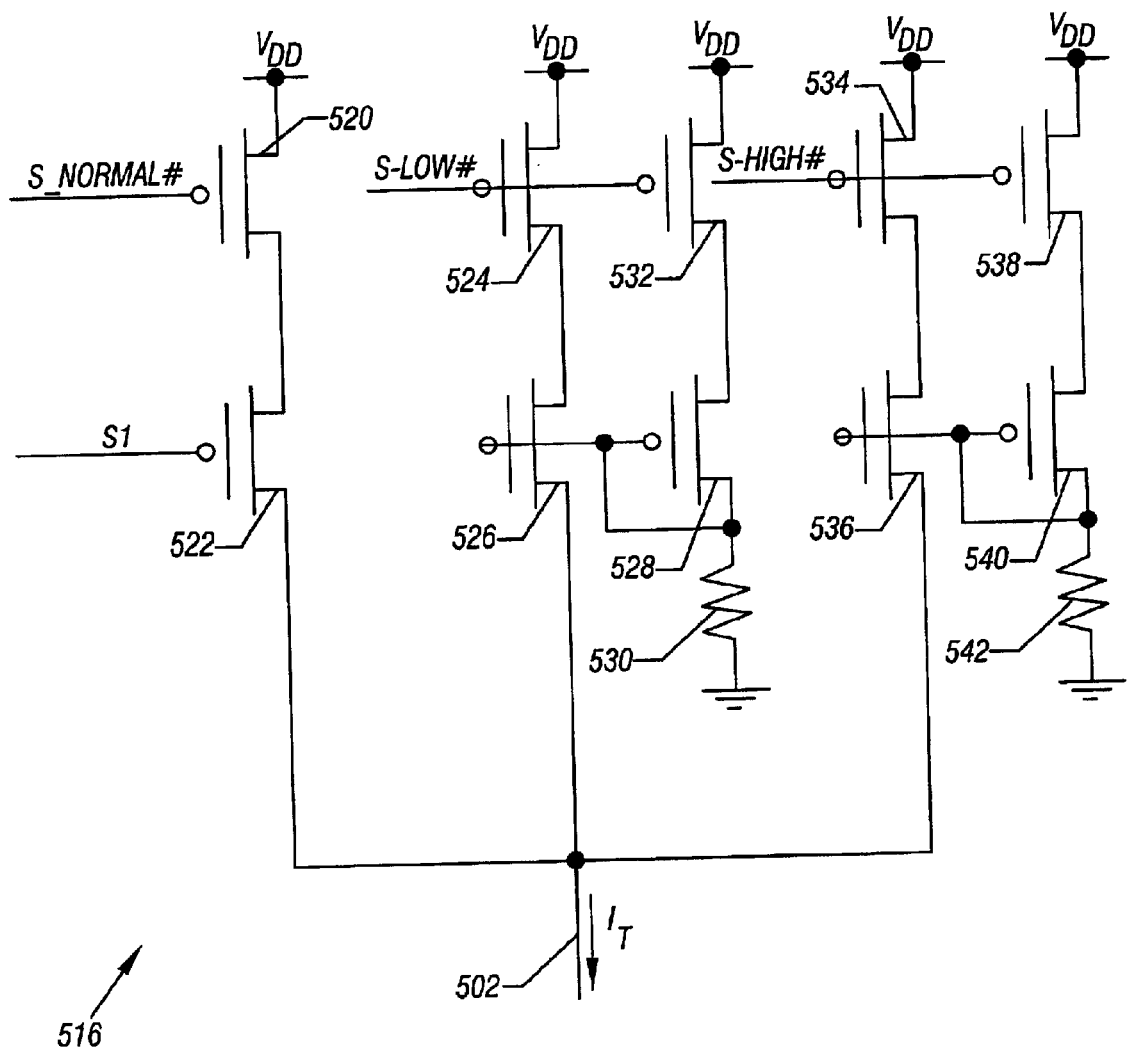
FIG. 13 is a schematic diagram of a threshold current source of the circuitry of FIG. 12.

Among the other features of the read path circuitry 499, in some embodiments of the invention, the circuitry 499 may include a D-type flip-flop 504 that stores the state of the output signal of the comparator 500 in response to an edge of a clock signal (called CLK). In this manner, in a read operation, after the comparator 500 has sufficient time to indicate the state of the associated memory cell 140, the state of the CLK signal transitions states to cause the flip-flop 504 to store the bit detected by the comparator 500. The flip-flop 504 may be connected to a buffer 506. Referring to FIG. 13, in some embodiments of the invention, the threshold current source 516 includes a PMOSFET 520 that has its source terminal coupled to a positive supply voltage called $V_{DD}$. The drain terminal of the PMOSFET 520 is coupled to the source terminal of another PMOSFET 522. The drain terminal of the PMOSFET 522, in turn, is coupled to the current communication line 502. The gate terminal of the PMOSFET 520 receives a signal called S_NORMAL#, and the gate terminal of the PMOSFET 522 receives the S1 signal. Due to this arrangement, during a normal read operation 107 (FIG. 7) when the margin is not being checked, the S_NORMAL# signal is asserted (driven low, for example) to activate the PMOSFET 520. The level of current that flows through the source-drain path of the PMOSFET 520 is set by the PMOSFET 522, as controlled by the S1 signal.

The threshold current source 516 contains additional circuitry to control the level of the $I_T$ current during a read operation where the threshold is lowered for purposes of checking the margin for the cell when the cell is in the crystalline state. In this manner, this circuitry includes a PMOSFET 524 that has its source terminal coupled to the VDD supply voltage. The gate terminal of the PMOSFET 524 receives a signal called S_LOW#. The drain terminal of the PMOSFET 524 is coupled to the source terminal of another PMOSFET 526, and the drain terminal of the PMOSFET 526 is coupled to the current communication line 502. Thus, due to this arrangement, during the low threshold mode of the threshold hold current source 516, the S_LOW# signal is asserted (driven low, for example) to cause the source-drain path of the PMOSFET 524 to conduct. The level of this current is set by the PMOSFET 526. The PMOSFET 526 is coupled in a current mirror arrangement with a PMOSFET 528. In this manner, the gate terminals of the PMOSFETs 526 and 528 are coupled together, and the gate terminal of the PMOSFET 528 is coupled to its drain terminal resistor 530 is coupled between the drain terminal of the PMOSFET 528 and ground. The source-drain path of a PMOSFET 532 is coupled between the VDD supply voltage and the source terminal of the PMOSFET 528. The gate terminal of the PMOSFET 532 is coupled to the gate terminal of the PMOSFET 524. Thus, due to this arrangement, the value of the resistance 530 may be chosen to lower the resistance threshold.

The threshold current source 516 may also include, in some embodiments of the invention, circuitry to raise the $I_T$ current level to check the margin when the memory cell is in the amorphous state. In this manner, the current source 516 may include a PMOSFET 536 that has its drain terminal coupled to the current communication line 502. The source terminal of the PMOSFET 536 is coupled to the drain terminal of a PMOSFET 534. The source terminal of the PMOSFET 534, in turn, is coupled to the VDD supply voltage. The gate terminal of the PMOSFET 534 receives a signal called S_HIGH#, a signal that is asserted (driven low, for example) to indicate the increase resistive threshold. Thus, when the S_HIGH# signal is asserted, the source-drain path of the PMOSFET 534 conducts, and the level of current conducted by this source-drain path is established by the PMOSFET 536.

The PMOSFET 536 is coupled in a current mirror arrangement with a PMOSFET 540. In this manner, the gate terminals of the PMOSFETs 536 and 540 are coupled together, and the gate terminal of the PMOSFET 540 is coupled to its drain terminal. A resistor 542 is coupled between the drain terminal and ground. The source-drain path of a PMOSFET 538 is coupled between the VDD supply voltage and the source terminal of the PMOSFET 540. The gate terminals of the PMOSFETs 534 and 538 are coupled together. Thus, due this arrangement, in response to the S_HIGH# signal being asserted, the $I_T$ current is raised to the level set by the resistance of the resistor 542.

Referring back to FIG. 4, among the other features of the memory device 33, the memory device 33 may include the control circuit 400 to generate signals to control such cycles in the memory device 33 as the read cycles, write preset cycles and write reset cycles. The control circuit 400 also initiates the read operation 108 compares (diamond 102) the bits during a margin check and controls the threshold current source to select the resistance threshold used during a particular read operation. The control circuit 400 receives signals (via input lines 401) from the memory bus 36 indicative of potential addresses and commands that involve the memory device 33. In this manner, the control circuit 300 may decode a burst write operation and generate the appropriate signals to control the storage of data associated with the burst write operation in targeted memory cells 140 of the memory device 33. The memory device 33 may also include additional circuitry, such as, for example, a data buffer 402 to temporarily store the data flowing into and out of the memory device 33 and communicates data to the memory bus 36 via data communication lines 405. The memory device 33 may also include an address buffer 408 that communicates with the memory bus via communication lines 407. The address buffer 408 shares the addresses associated with memory operations as well as decodes the addresses and to some extent may generate the address signals (on the communication lines 410) that are provided to the row 124 and column 122 decoders. As noted above, the control circuit 400 also increments the counters 409 as appropriate and stores minimum set sweep fall times and reset current levels in the memory of the device 33.

Referring back to FIG. 2, in some embodiments of the invention, the computer system 30 may include other components than the memory controller hub 34 and the memory 32. In particular, in some embodiments of the invention, the computer system 30 may include a processor 42 (one or more microprocessors or controllers, as examples) that is coupled to a system bus 40. The system bus 40, in turn is coupled to the memory controller hub 34 along with an Accelerated Graphics Port (AGP) bus 44. The AGP is described in detail in the Accelerated Graphics Port Interface Specification, Revision 1.0, published on Jul. 31, 1996, by Intel Corporation of Santa Clara, Calif.

The computer system 30 may also include a display controller 46 that is coupled to the AGP bus 44 and generates signals to drive a display 48. The memory controller hub 34 is also coupled (via a hub interface 50) to an input/output (I/O) hub 52. The I/O hub 52 may provide interfaces to, for example a Peripheral Component Interconnect (PCI) bus 54 and an expansion bus 62. The PCI Specification is available from The PCI Special Interest Group, Portland, Oreg. 97214. The PCI bus 54 may be coupled to a network interface card (NIC) 56, and the I/O controller 64 may receive input from a mouse 66, and the I/O controller 64 may receive input from a mouse 66 and a keyboard 68, as well as control operation of a floppy disk drive 70. The I/O hub 52 may also control operation of a CD-ROM drive 58 and control operation of a hard disk drive 60.

In some embodiments of the invention, the memory controller hub 34 may include a memory controller 35. In this manner, the memory controller 35 serves as an interface between the memory bus 36 and the PCI 54, system 40 and AGP 44 buses. The memory controller 35 generates signals to indicate the control signals, address signals and data signals that are associated with a particular write or read operation that targets cells of the phase change material memory 32.

While the invention has been disclosed with respect to a limited number of embodiments, those skilled in the art, having the benefit of this disclosure, will appreciate numerous modifications and variations therefrom. It is intended that the appended claims cover all such modifications and variations as fall within the true spirit and scope of the invention.

What is claimed is:

1. A method comprising:
   determining whether a storage level of a phase change memory cell is within a predefined margin from a resistance threshold level; and
   in response to the determination, selectively writing to the cell.

2. The method of claim 1, further comprising:
   reading the cell; and
   performing the determination in response to the reading.

3. The method of claim 2, wherein the performing occurs in response to transferring an indication of the memory state to an output buffer.

4. The method of claim 1, wherein the determining comprises:
   comparing a resistance exhibited by the cell to a first resistance threshold to detect a first data bit;
   comparing the resistance to a second different threshold to detect a second data bit; and
   comparing the first and second bits to determine whether the storage level is within the predefined margin.

5. The method of claim 1, wherein
the memory cell is in an amorphous state; and
the determining comprises comparing a resistance exhibited by the cell to a first resistance threshold and comparing the resistance to a second resistance threshold greater than the first resistance threshold.

6. The method of claim 5, wherein the second resistance threshold is approximately twenty percent less than the first resistance threshold.

7. The method of claim 1, wherein
the memory cell is in a crystalline state;
the determining the degree of degradation comprises comparing a resistance exhibited by the cell to a first resistance threshold and comparing the resistance to a second resistance threshold less than the first resistance threshold.

8. The method of claim 7, wherein the second resistance threshold is approximately twenty percent greater than the first resistance threshold.

9. The method of claim 1, further comprising:
writing to the cell in response to the determination that the storage level is within the margin.

10. The method of claim 1, wherein the determining comprises:
flowing a current through the memory cell to read a memory state of the cell.

11. A method comprising:
programming a phase change memory cell to indicate a memory state; and
selectively refreshing the memory cell in response to the detection that a storage level of the memory cell is within a predetermined margin from a resistance threshold level.

12. The method of claim 11, wherein the programming comprises placing the memory cell in one of an amorphous state and a crystalline state.

13. The method of claim 11, further comprising:
performing the detection in response to a read from the memory cell.

14. The method of claim 11, wherein the refreshing comprises:
reprogramming the memory cell.

15. A method comprising:
in response to a read operation from a phase change cell, testing the cell to determine whether a storage level of the phase change memory cell is within a predefined margin from a resistance threshold level.

16. The method of claim 15, wherein the storage level indicates a memory state of the cell.

17. The method of claim 15, wherein the storage level comprises a resistance exhibited by the cell.

18. A memory device comprising:
a phase change memory cell; and
a circuit to:
determine whether a storage level of the phase change memory cell is within a predefined margin from a resistance threshold level; and
in response to the determination, selectively write to the cell.

19. The memory device of claim 18, wherein the circuit detects a memory state of the cell and performs the determination in response to the reading of the cell.

20. The memory device of claim 18, further comprising:
an output buffer to receive an indication of the memory state in response to the reading of the cell,
wherein the circuit determines the margin in response to the transfer of the indication to the output buffer.

21. The memory device of claim 18, further comprising
a comparator to compare an indication of a resistance exhibited by the cell to the resistance threshold to generate a first indication of a state of the cell and compare the resistance exhibited by the cell to a different second resistance threshold to generate a second indication of the state, the first and second indications indicating whether the storage level is within the margin.

22. The memory device of claim 18, wherein the memory cell is in the crystalline state, the memory device further comprising:
a comparator to compare an indication of a resistance exhibited by the cell to the resistance threshold to generate a first indication of a state of the cell and compare the resistance to a second different resistance threshold less than the first resistance threshold to generate a second indication of the state of the cell.

23. The memory device of claim 18, wherein the memory cell is in an amorphous state, the memory device further comprising:
a comparator to compare an indication of a resistance exhibited by the cell to the resistance threshold to generate a first indication of a state of the cell and compare an indication of the resistance to a second resistance threshold greater than the first resistance threshold to generate an indication of the state of the cell.

24. A memory device comprising:
a phase change memory cell; and
a circuit to program the memory cell to exhibit a resistance to indicate a memory state and selectively refresh the memory cell in response to determination of whether a storage level of a phase change memory cell is within a predefined margin from a resistance threshold.

25. The memory device of claim 24, wherein the circuit generates a current to place the memory cell in one of an amorphous state and a crystalline state.

26. The memory device of claim 24, wherein the circuit determines the margin in response to a read from the memory cell.

27. The memory device of claim 24, wherein the circuit reprograms the memory cell to refresh the memory cell.

28. A memory device comprising:
a phase change memory cell; and
a circuit to in response to a read operation from a phase change cell, test the cell to determine whether a storage level of the phase change memory cell is within a predefined margin from a resistance threshold.

29. The memory device of claim 28, wherein the storage level indicates a memory state of the cell.

30. The memory device of claim 28, wherein the storage level comprises a resistance exhibited by the memory cell.

31. A computer system comprising:
a processor;
a phase change memory cell; and
a circuit to:
determine whether a storage level of the phase change memory cell is within a predefined margin from a resistance threshold, and
in response to the determination, selectively write to the cell.

32. The computer system of claim 31, wherein the circuit detects a memory state of the cell and performs the determination in response to the reading of the cell.

33. The computer system of claim 31, further comprising:
an output buffer to receive an indication of the memory state in response to the reading of the cell,
wherein the circuit determines the margin in response to the transfer of the indication to the output buffer.

34. The computer system of claim 31, further comprising:
a comparator to compare an indication of a resistance exhibited by the cell to a first resistance threshold to generate a first indication of a state of the cell and compare the resistance to a different second resistance threshold to generate a second indication of the state, the first and second indications indicating whether the storage level is within the margin.

35. The computer system of claim 31, wherein
the memory cell is in the crystalline state, the memory device further comprising:
a comparator to compare an indication of a resistance exhibited by the cell to a first resistance threshold to generate a first indication of a state of the cell and compare the resistance to a second threshold less than the first resistance threshold to generate a second indication of the state of the cell.

36. The computer system of claim 31, wherein
the memory cell is in an amorphous state, the memory device further comprising:
a comparator to compare an indication of a resistance exhibited by the cell to a first resistance threshold to generate a first indication of a state of the cell and compare an indication of the resistance to a second threshold greater than the first threshold to generate an indication of the state of the cell.

37. A computer system comprising:
a processor;
a phase change memory cell; and
a circuit to program the memory cell to exhibit a resistance to indicate a memory state and selectively refresh the memory cell in response to whether a storage level of a phase change memory cell is within a predefined margin from a resistance threshold.

38. The computer system of claim 37, wherein the circuit generates a current to place the memory cell in one of an amorphous state and a crystalline state.

39. The computer system of claim 37, wherein the circuit determines the margin in response to a read from the memory cell.

40. The computer system of claim 37, wherein the circuit reprograms the memory cell to refresh the memory cell.

41. A computer system comprising;
a processor;
a phase change memory cell; and
a circuit to in response to a read operation from a phase change cell, test the cell to determine whether a storage level of the phase change memory cell is within a predefined margin from a resistance threshold.

42. The computer system of claim 41, wherein the storage level indicates a memory state of the cell.

43. The computer system of claim 41, wherein the storage level comprises a resistance.

44. A method comprising:
reading all cells of a phase change memory device; and
for each read memory cell, determining whether a storage level of the cell is within a predefined margin from a resistance threshold and in response to the determination selectively writing to the cell.

45. The method of claim 44, wherein the reading comprises interlacing read operations to read the cells with other operations.

46. The method of claim 44, further comprising:
performing the act of reading in response to the expiration of a predetermined duration of time.

47. A method comprising:
resetting cells of a phase change memory device;
for each cell reset, determining a reset current level that provides a sufficient margin for the cell; and
setting a minimum current to be used for the resetting based on the determination.

48. The method of claim 47, further comprising:
increasing the minimum current based on a number of the reset current levels that exceed the minimum current level before the increase.

49. The method of claim 47, wherein the cells comprise cells of a block of the memory device.

50. The method of claim 49, wherein each cell of the block is associated with the same threshold sensor.

51. A method comprising:
setting cells of a phase change memory device;
for each cell, determining a sweep fall time that provides a sufficient margin for the cell; and
establishing a minimum sweep fall time for the cells based on the determination.

52. The method of claim 51, wherein the establishing comprises:
increasing the minimum sweep fall time over the minimum sweep fall time before increase in response to the number of cells using a sweep time above the minimum sweep fall time.

53. The method of claim 51, wherein the cells comprise cells of a block of the memory device.

54. The method of claim 53, wherein the each cell of the block is associated with the same threshold sensor.

* * * * *